US010103196B2

(12) United States Patent
Tokashiki

(10) Patent No.: US 10,103,196 B2
(45) Date of Patent: Oct. 16, 2018

(54) METHODS OF FORMING MAGNETIC MEMORY CELLS, AND METHODS OF FORMING ARRAYS OF MAGNETIC MEMORY CELLS

(71) Applicant: Micron Technology, Inc., Boise, ID (US)

(72) Inventor: Ken Tokashiki, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/251,867

(22) Filed: Aug. 30, 2016

(65) Prior Publication Data

US 2018/0061886 A1 Mar. 1, 2018

(51) Int. Cl.
| | | |
|---|---|---|
| H01L 43/08 | (2006.01) | |
| H01L 27/22 | (2006.01) | |
| H01L 43/12 | (2006.01) | |
| H01L 43/10 | (2006.01) | |
| H01L 43/02 | (2006.01) | |

(52) U.S. Cl.
CPC ............ *H01L 27/222* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 2002/0145835 A1 | 10/2002 | Suzuki et al. | |
| 2014/0291288 A1* | 10/2014 | Gu | H01L 21/3065 216/51 |
| 2015/0044781 A1 | 2/2015 | Tokashiki | |
| 2015/0069560 A1 | 3/2015 | Cho et al. | |
| 2015/0287911 A1 | 10/2015 | Kim et al. | |
| 2015/0340603 A1 | 11/2015 | Shen et al. | |
| 2016/0155932 A1 | 6/2016 | Chen et al. | |
| 2017/0186944 A1* | 6/2017 | Annunziata | H01L 43/08 |

OTHER PUBLICATIONS

Sugiura et al (ion Beam Etching Technology for High-Density Spin Transfer Torque magentic Random Access memory, Japanese Journal of Applied Physics 48 (2009)).*

(Continued)

*Primary Examiner* — Ali Naraghi
(74) *Attorney, Agent, or Firm* — TraskBritt

(57) ABSTRACT

Methods of forming a magnetic memory cell are disclosed. The method comprises forming a magnetic cell core material over a substrate, wherein forming the magnetic cell core comprises forming a first magnetic region over the substrate, forming a tunnel barrier material over the first magnetic region, and forming a second magnetic region over the tunnel barrier material. A temperature of at least one of the substrate or a wafer stage underlying the substrate is maintained at a temperature below about 0° C. and the magnetic cell core material is exposed to at least a first beam comprising one of an ion beam or a neutral beam comprising ions or elements of at least one noble gas to remove portions of the magnetic cell core material. Related magnetic memory cells and methods of forming an array of memory cells are also disclosed.

19 Claims, 7 Drawing Sheets

(56) References Cited

OTHER PUBLICATIONS

Gu et al 9A new Metallic Complex reaction etching for transition metals by a low temperature neutral beam process, J. Phys. D: Appl. Phys 47 (2014)).*

Jeong et al., Novel Oxygen Showering Process (OSP) for Extreme Damage Suppression of Sub-20nm High Density p-MTJ Array without IBE Treatment, Symposium on VLSI Technology Digest of Technical Papers, (2015), pp. T158-T159.

Jeong et al., Influence of Hydrogen Patterning Gas on Electric and Magnetic Properties of Perpendicular Magnetic Tunnel Junctions, Journal of Applied Physics, vol. 115, (2014), pp. 17C727-1-17C727-3.

Khaja et al., Physical Understanding of Cryogenic Implant Benefits for Electrical Junction Stability, Applied Physics Letters, vol. 100, (2012), pp. 112102-112102-4.

Kinoshita et al., Plasma Process Induced Physical Damages on Multilayered Magnetic Films for Magnetic Domain Wall Motion, Japanese Journal of Applied Physics, vol. 53, (2014), pp. 03DF03-1-03DF03-6.

Ohsawa et al., Precise Damage Observation in Ion-Beam Etched MTJ, IEEE Transactions on Magnetis, DOI 10.1109/TMAG.2015.1512588, (2016), 4 pages.

* cited by examiner

METHODS OF FORMING MAGNETIC MEMORY CELLS, AND METHODS OF FORMING ARRAYS OF MAGNETIC MEMORY CELLS

TECHNICAL FIELD

Embodiments disclosed herein relate to methods of forming semiconductor structures including magnetic materials. More particularly, embodiments of the disclosure relate to methods of forming STT-MRAM semiconductor structures, methods of forming magnetic memory cells, to methods of forming related arrays of magnetic memory cells, and to related magnetic memory cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region in between. The free region and the fixed region may exhibit magnetic orientations that are either horizontally oriented ("in-plane") or perpendicularly oriented ("out-of-plane") relative to the width of the regions. The fixed region includes a magnetic material that has a substantially fixed magnetic orientation (e.g., a non-switchable magnetic orientation during normal operation). The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the STT-MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the read and write operations of the STT-MRAM cell. After switching the magnetic orientation of the free region to achieve the parallel configuration or the anti-parallel configuration associated with a desired logic state, the magnetic orientation of the free region is usually desired to be maintained, during a "storage" stage, until the STT-MRAM cell is to be rewritten to a different configuration (i.e., to a different logic state).

Switching of the magnetic orientation of the free region of a magnetic memory cell including a magnetic tunnel junction ("MTJ") may be affected by the tunnel magnetoresistance ("TMR"). The TMR of a MTJ is a function of the resistance between an upper electrode and a lower electrode between which the MTJ is disposed, in the high electrical resistance state and the low electrical resistance state. Specifically, the TMR measures the difference between a cell's electrical resistance in the anti-parallel configuration ($R_{ap}$) and its electrical resistance in the parallel configuration ($R_p$) to $R_p$ (i.e., TMR=$100 \cdot (R_{ap}-R_p)/R_p$). Thus, the TMR is equivalent to the change in resistance observed by changing the magnetic state of the free layer. Generally, a MTJ with a homogeneous crystal structure (e.g., a bcc (001) crystal structure), having few structural defects in the microstructure of its magnetic material, has a higher TMR than a MTJ with structural defects. A magnetic memory cell with high TMR may have a high read-out signal, which may speed the reading of the cell during operation. A higher TMR is preferred for a reliable read operation as it will generate a larger signal difference between the on and off states of the cell. In other words, the higher the TMR, the more sensitive the device, and the easier to distinguish between logic states of an associated magnetic memory cell.

Patterning of magnetic memory cells often includes reactive ion etching (RIE), which may introduce chemical damage to such memory cells. Reactive ion etching may include exposing the magnetic memory cell to one or more gases including halogen-based ions, hydrogen ions, oxygen ions, or other reactive gas components that may undesirably react with the magnetic materials and a tunnel barrier material of the magnetic memory cells. Undesired reactions between the magnetic materials or the tunnel barrier material and reactive gases may affect the crystal structure of the magnetic material cell and undesirably alter properties of the magnetic memory cell.

Ion beam etching (IBE) is a potential alternative for patterning of MRAM cells. However, conventional ion beam etching may damage the relatively thin materials of the magnetic materials of the memory cells. At conventional ion beam etching energies (e.g., about 200 eV), noble gases and other ion sources included in the ion beam may implant into the magnetic material, often several monolayers into an exposed surface of the magnetic material. The implanted materials may distort a crystal structure and induce lattice distortion in the magnetic materials, which may negatively alter the magnetic properties of the magnetic materials and associated memory cells. For example, intermixing and diffusion of elements of the ion beam and of adjacent materials in the magnetic stack may reduce one or more of a coercitivy ($H_c$), a magnetism, or a tunnel magnetoresistance (TMR), and may increase a resistance (i.e., an increased switching current, $J_c$), of the magnetic memory cell.

In addition, materials of the magnetic cell structure may exhibit a relatively low vapor pressure and may not, therefore, be carried out of an etch chamber during or after patterning. Accordingly, such materials may resputter (e.g., redeposit) on sidewalls of memory cell stack structures being patterned during the etching process. The resputtered material may be electrically conductive and cause an electrical short between adjacent memory cells and between, for example, upper and lower electrodes of the same memory cell.

DETAILED DESCRIPTION

Figure 1:
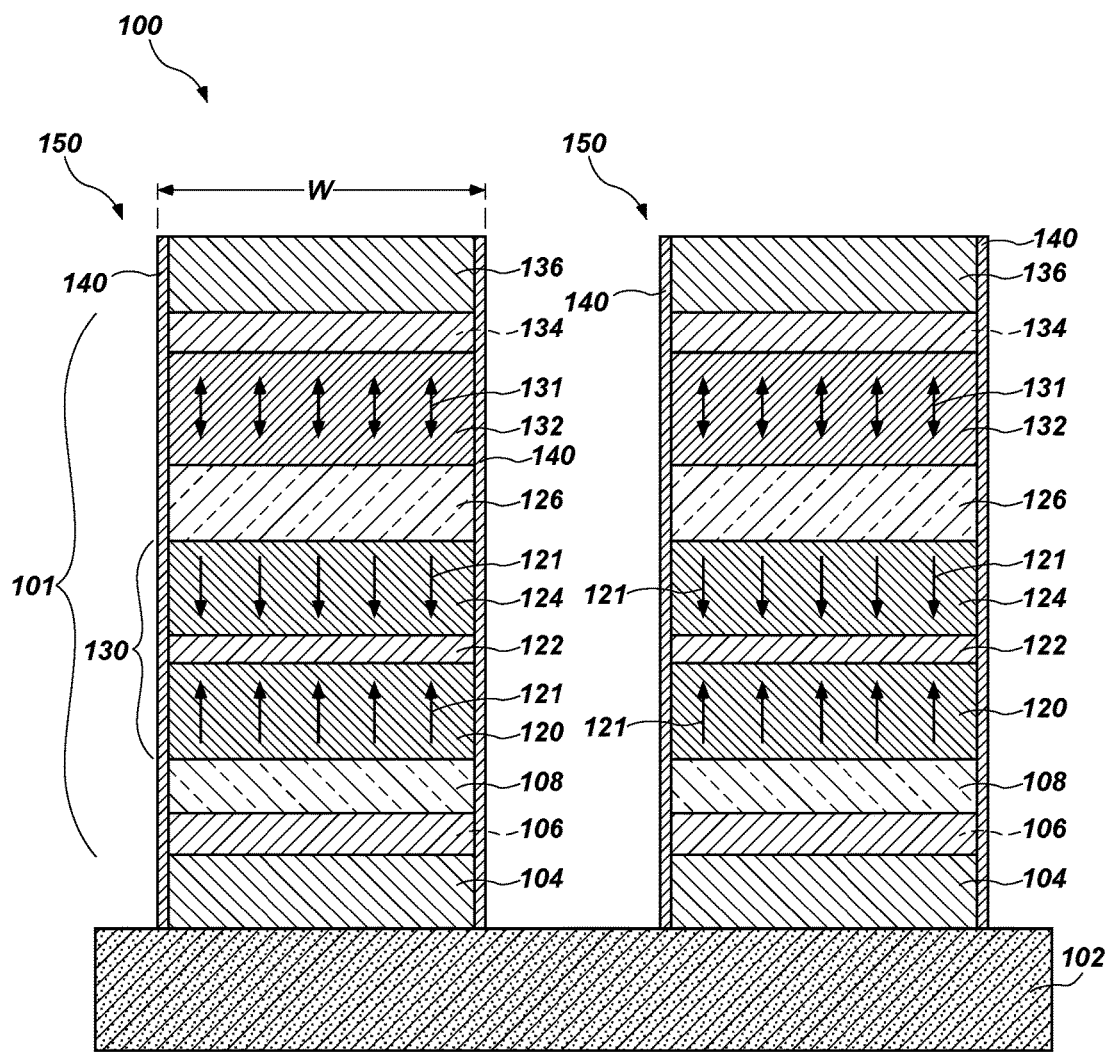
FIG. 1 is a simplified cross-sectional view of an array of magnetic memory cells, according to embodiments of the disclosure.

The illustrations included herewith are not meant to be actual views of any particular systems or magnetic memory cells, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor devices, magnetic cell cores, or magnetic memory cells, and the semiconductor devices, magnetic cell cores, or magnetic memory cells described below do not form complete semiconductor devices, magnetic cell structures, or magnetic memory cells. Only those process acts and structures necessary to understand the embodiments described herein are described in detail below. Additional acts to form a complete magnetic memory cell including the magnetic cell cores described herein may be performed by conventional techniques.

According to embodiments disclosed herein, a magnetic memory cell including a magnetic cell core may be formed by beam etching with an ion beam, a neutral beam, or combinations thereof. A stack of magnetic materials may be formed (e.g., patterned) with a first beam at a temperature below about 0° C. (e.g., such as below about −50° C.) to form the magnetic cell core. The first beam may comprise at least one noble gas (e.g., neon, argon, krypton, xenon, or combinations thereof) and, in some embodiments, may further include at least one oxygen-containing gas. The at least one oxygen-containing gas may include at least one of oxygen, ozone, nitric oxide, nitrous oxide, nitrogen dioxide, carbon monoxide, carbon dioxide, or combinations thereof. After patterning the magnetic memory cell, sidewalls of the magnetic memory cell may be exposed to at least a second beam comprising at least one oxygen-containing gas and, in some embodiments, at least one noble gas, the second beam having a lower energy and a different beam angle than the first beam. The second beam may oxidize at least a portion of sidewalls of the magnetic memory cell. Forming the patterned magnetic memory cell at a temperature below about 0° C. may substantially reduce or eliminate an amount of intermixing between magnetic materials and adjacent tunnel barrier materials. In addition, forming the magnetic memory cell at a temperature below about 0° C. may substantially reduce or eliminate an amount of diffusion and intermixing of beam elements (e.g., the at least one noble gas, the oxygen-containing gas, or both) into the materials of the magnetic materials. Magnetic memory cells formed according to the embodiments described herein may exhibit improved crystal structures (e.g., symmetry) and improved magnetic properties (e.g., increased TMR, reduced resistance, reduced switching current density $J_c$, etc.).

FIG. 1 is a simplified cross-sectional view of an array 100 of magnetic memory cells 150 according to embodiments of the disclosure. The magnetic memory cells 150 each include a magnetic cell core 101 disposed over a substrate 102. The magnetic cell core 101 may be disposed between an upper electrode 136 and a lower electrode 104. The magnetic cell core 101 may include a magnetic region and another magnetic region such as, for example, a "fixed region" 130 and a "free region" 132, respectively. A tunnel barrier material 126 may be disposed between the fixed region 130 and the free region 132. The fixed region 130, the free region 132, and the intervening tunnel barrier material 126 may form a magnetic tunnel junction.

The substrate 102 may include a base material or other construction upon which components, such as those within magnetic memory cells, are formed. The substrate 102 may be a semiconductor substrate, a base semiconductor material on a supporting substrate, a metal electrode, or a semiconductor substrate having one or more materials, structures, or regions formed thereon. The substrate 102 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, wherein x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation.

The lower electrode 104 may overlie the substrate 102. The lower electrode 104 may include a metal such as copper, tungsten, platinum, palladium, titanium, tantalum, nickel, titanium nitride (TiN), tantalum nitride (TaN), tungsten nitride (WN), polysilicon, a metal silicide, a metal alloy, or combinations thereof.

One or more lower intermediary regions 106 may optionally overlie the lower electrode 104. The lower intermediary region 106, if included, may be configured to inhibit diffusion of species between the lower electrode 104 and materials overlying the lower electrode 104. The lower intermediary region 106 may include a conductive material such as one or more of copper, tantalum, titanium, tungsten, ruthenium, tantalum nitride, or titanium nitride.

A seed material 108 may overlie the lower intermediary region 106. In some embodiments, the seed material 108 directly overlies and contacts the lower intermediary region 106. In other embodiments, the seed material 108 directly overlies and contacts the lower electrode 104. The seed material 108 may comprise one or more of tantalum, ruthenium, titanium, or platinum. In some embodiments, the seed material 108 comprises tantalum, platinum, and ruthenium. In some such embodiments, the seed material 108 may comprise distinct regions of each of the tantalum, platinum, and ruthenium. In yet other embodiments, the seed material 108 may include a mixture of two or more of tantalum, ruthenium, titanium, or platinum.

The fixed region 130 may overlie the seed material 108. In some embodiments, the fixed region 130 directly overlies and contacts the seed material 108. The fixed region 130 may include a first magnetic portion 120 over seed material 108, a coupling material 122 over the first magnetic portion 120, and a second magnetic portion 124 over the coupling material 122. The first magnetic portion 120 and the second magnetic portion 124 of the fixed region 130 may include a fixed magnetic orientation, as indicated by arrows 121. The fixed magnetic orientation may be north, south, east, west, etc. The fixed magnetic orientation of the first magnetic portion 120 and the second magnetic portion 124 may be the same or may be different.

In some embodiments, the fixed region 130 may include one or more magnetic materials and, optionally, one or more non-magnetic materials. By way of nonlimiting example, the fixed region 130 may be configured as a synthetic antiferromagnetic including a sub-region of ruthenium or tantalum adjoined by magnetic sub-regions. The magnetic sub-regions may include a material including cobalt, and at least one of palladium, platinum, or a combination thereof, a CoFeB material, or combinations thereof. As used herein, the term "CoFeB material" means and includes a material comprising cobalt (Co), iron (Fe), and boron (B) (e.g., $Co_xFe_yB_z$, wherein x=10 to 80, y=10 to 80, and z=0 to 50). A CoFeB material may or may not exhibit magnetism, depending on its configuration (e.g., its thickness). In some embodiments, the fixed region 130 may include at least one of cobalt, iron, or nickel and may further include at least one non-magnetic material such as boron, zinc, aluminum, titanium, ruthenium, tantalum, silicon, silver, gold, copper, carbon, or nitrogen. By way of nonlimiting example, the fixed region 130 may include CoFe or NiFe and may further include boron.

Figure 2:
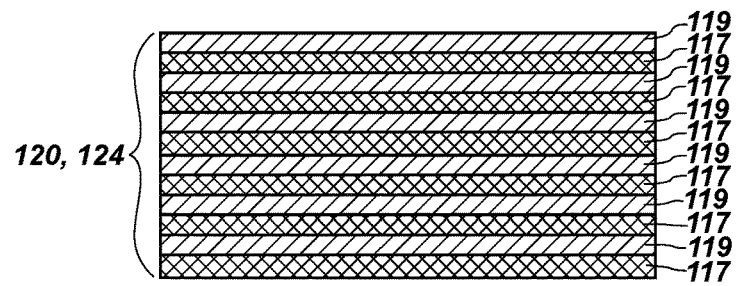
FIG. 2 is a simplified cross-sectional view of a magnetic material including alternating portions of a magnetic material and a conductive material, according to embodiments of the disclosure.

In other embodiments, the first magnetic portion 120 includes a superlattice structure and the second magnetic portion 124 includes another superlattice structure. Referring to FIG. 2, in some such embodiments, the first magnetic portion 120 and the second magnetic portion 124 may include alternating portions of a magnetic material 117 and a conductive material 119. The conductive material 119 may enable the magnetic material 117 to exhibit a perpendicular anisotropy (i.e., a vertical magnetic orientation). The conductive material 119 may include at least one of platinum, palladium, nickel, or iridium. In some embodiments, the magnetic material 117 includes cobalt and the conductive material 119 includes platinum. Although FIG. 2 depicts six regions of the magnetic material 117 and six regions of the conductive material 119 in the first magnetic portion 120, the magnetic portion is not so limited and may include any number (e.g., one, two, three, four five, etc.) of alternating regions of magnetic material 117 and conductive material 119.

Referring back to FIG. 1, the coupling material 122 may directly overlie and contact the first magnetic portion 120. The coupling material 122 may include ruthenium, rhodium, or a combination thereof.

The second magnetic portion 124 may directly overlie and contact the coupling material 122. The second magnetic portion 124 may include the same materials and may be substantially the same as at least a portion of the first magnetic portion 120. In some embodiments, the second magnetic portion 124 includes a material including cobalt and at least one of palladium or platinum.

In yet other embodiments, the fixed region 130 may include an antiferromagnetic material adjacent to a ferromagnetic material. The antiferromagnetic material may include at least one of PtMn, IrMn, MnO, MnS, MnTe, $MnF_2$, $FeCl_2$, FeO, $CoCl_2$, CoO, $NiCl_2$, NiO, or Cr. In other embodiments, the antiferromagnetic material may include one or more of ruthenium, rhodium, palladium, osmium, iridium, platinum, gold, or silver. The ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $CuOFe_2O_3$, $MgOFe_2O_3$, EuO, or $Y_2Fe_5O_{12}$.

A tunnel barrier material 126 may overlie the fixed region 130. The tunnel barrier material 126 may be disposed between the fixed region 130 and the free region 132. In some embodiments, the tunnel barrier material 126 directly overlies and contacts the free region 130. The tunnel barrier material 126 may include a non-magnetic (e.g., a magnetically insulative) material including oxide materials and nitride materials such as magnesium oxide (MgO), aluminum oxide ($Al_2O_3$), titanium dioxide ($TiO_2$), titanium nitride (TiN), aluminum nitride (AlN), or other oxide or nitride materials. In other embodiments, the tunnel barrier material 126 may include an electrically conductive, non-magnetic material, such as materials used in spin valve structures.

The free region 132 may overlie the tunnel barrier material 126. The free region 132 may be homogeneous, or may include more than one sub-region. The free region 132 may include a magnetic material exhibiting a switchable magnetic orientation, indicated by arrows 131, during use and operation of the memory cell. The switchable magnetic orientation may be switched between a parallel configuration and an anti-parallel configuration by the application of a current or applied field to the magnetic cell structure 100.

In some embodiments, the free region 132 may be a conventional free region (i.e., a magnetic region including different materials than the first magnetic portion 120, the second magnetic portion 124, and the coupling material 122). In other embodiments, the free region 132 may include the same materials as each of the first magnetic portion 120 and the second magnetic portion 124 of the fixed region 130. However, the free region 132 is not so limited and may include other suitable magnetic materials that exhibit a switchable magnetic orientation.

One or more upper intermediary regions 134 may optionally be disposed over the free region 132. The upper intermediary region 134, if included, may be configured to inhibit diffusion of species between the upper electrode 136 and underlying materials during operation of the memory cell. The upper intermediary region 134 may include a conductive material (e.g., one or more materials such as copper, tantalum, titanium, tungsten, ruthenium, tantalum nitride, or titanium nitride) that may form a conductive capping region. In other embodiments, the upper intermediary region 134 may also include an insulating material such as MgO, $Al_2O_3$, $TiO_2$, or combinations thereof.

The upper electrode 136 may overlie the upper intermediary region 134. The upper electrode 136 may include copper, tungsten, platinum, palladium, titanium, tantalum, nickel, titanium nitride, tantalum nitride, tungsten nitride, polysilicon, a metal silicide, a metal alloy, or combinations thereof. In some embodiments, the upper electrode 136 includes the same materials as the lower electrode 104.

An oxide material 140 may overlie sidewalls of the magnetic memory cells 150. In some embodiments, the oxide material 140 may be electrically insulative. The oxide material 140 may extend from the upper electrode 136 to a surface of the substrate 102. In other embodiments, the oxide material 140 may overlie only the tunnel barrier material 126 and the magnetic materials of the fixed region 130 and the free region 132. In some such embodiments, the oxide material 140 may extend from a portion of the fixed region 130 to a portion of the free region 132 and may not, therefore, extend over, for example, the lower electrode 104, the lower intermediary region 106, the seed material 108, the upper intermediary region 134, or the upper electrode 136.

The oxide material 140 may comprise a metal oxide of a material over which the oxide material 140 is disposed. Stated another way, if the oxide material 140 is disposed over a lower electrode 104 comprising titanium, the metal oxide material over the lower electrode 104 may comprise a titanium oxide (e.g., $TiO_2$). As another example, the oxide material 140 may comprise a metal oxide of a metal (e.g., a magnetic material) at portions overlying the free region 130 and the fixed region 132 and may comprise an oxide or an oxygen rich material at portions overlying the tunnel barrier material 126.

Accordingly, the oxide material 140 may comprise one or more different compositions along the sidewalls of the magnetic memory cells 150, depending on a composition of the material over which the oxide material 140 is disposed. In other words, portions of the oxide material 140 overlying each of the lower electrode 104, the lower intermediary region 106, the fixed region 130, the tunnel barrier material 126, the free region 132, the upper intermediary region 134, and the upper electrode 136 may differ depending on a composition of such components of the magnetic memory cell 150.

The oxide material 140 may have a thickness between about one monolayer and about ten percent of a width W of the magnetic memory cells 150. In some embodiments, the width W may be between about 20 nm and about 40 nm, such as about 25 nm. In some such embodiments, the oxide material 140 may have a thickness between about one monolayer and about 4 nm, such as between about 1 nm and about 3 nm, although the disclosure is not limited to such thicknesses.

Although the magnetic memory cells 150 of FIG. 1 are illustrated as "bottom-pinned" memory cells (i.e., memory cells in which the fixed region 130 is disposed under the free region 132), the magnetic memory cells 150 may comprise "top-pinned" memory cells. In some such embodiments, a relative location of the free region 132 and the fixed region 130 may be switched. In other words, the free region 132 may be located closer to the substrate 102 than the fixed region 130.

Figure 3:
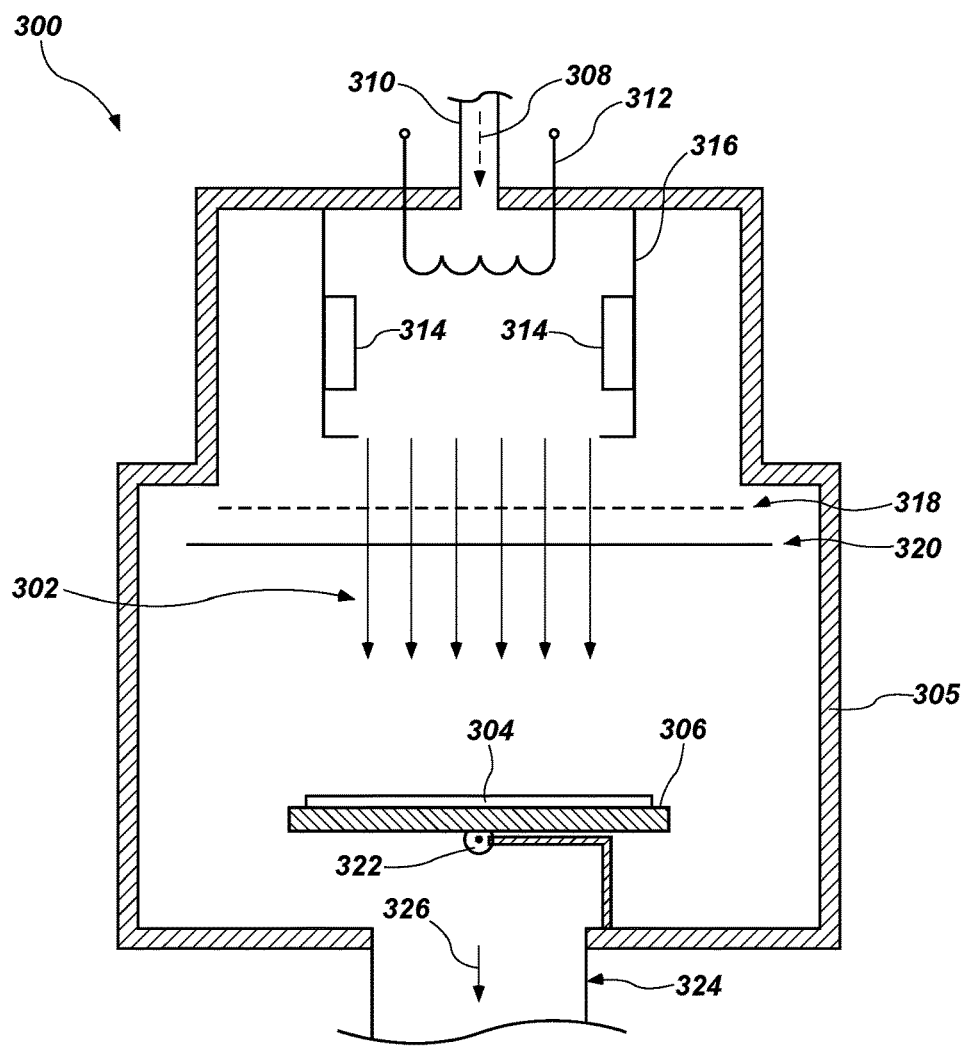
FIG. 3 is a simplified schematic of an etching tool, according to embodiments of the disclosure.

The magnetic memory cells 150 of FIG. 1 may be formed by forming and patterning a stack of magnetic materials with ion beam etching (IBE) (also referred to as ion beam sputtering or ion beam milling), neutral beam etching (NBE) (also referred to as neutral beam milling), or a combination thereof. FIG. 3 is a simplified schematic of an etching tool 300 that may be used to pattern a plurality of magnetic memory cells, according to embodiments of the disclosure. The etching tool 300 may comprise a beam machine, such as an ion beam etching tool (also referred to as a sputter etching tool, an ion beam milling tool, or an ion beam reactor) or a neutral beam etching tool (also referred to as a neutral beam milling tool or a neutral beam reactor), although the disclosure is not so limited. A source gas 308 may enter the etching tool 300 through a source gas inlet 310. A gas outlet 324 may operably couple an operating chamber 305 of the etching tool 300 to a vacuum chamber to evacuate outlet gases, indicated by arrow 326, from the chamber 305. In some embodiments, the etching tool 300 is operated at vacuum pressures. Such etching tools are known in the art and, therefore, are not described in detail herein.

The etching tool 300 may be configured to provide a beam 302 comprising an ion beam, a neutral beam, or both accelerated at a substantial velocity toward a substrate 304 disposed on a wafer stage 306 (which may also be referred to as a wafer table or a chuck). The beam 302 may comprise ions or elements of the source gas 308. The substrate 304 may comprise, for example, a stack of materials to be patterned to form the array 100 (FIG. 1) of magnetic memory cells 150 (FIG. 1).

The source gas 308 may be exposed to a stream of high-energy electrons between a cathode 312 and at least one anode 314 in a plasma region 316 of the etching tool 300. In some embodiments, the electrons may ionize the source gas 308 to a high-energy state with a positive charge in the plasma region 316. An optically aligned grid 318 may be configured to substantially collimate and direct the beam 302 toward the substrate 304. In some embodiments, the beam 302 may pass through a neutralizer filament 320 prior to contacting the substrate 304. In some embodiments, the wafer stage 306 may be negatively grounded and the beam 302 (which, in some embodiments, may comprise positively charged ions) may be attracted to the wafer stage 306. Material from surfaces of the substrate 304 may be removed from the substrate 304 responsive to exposure to the beam 302.

The wafer stage 306 may include a rotating member 322 configured to rotate the wafer stage 306 and the substrate 304 during use and operation of the etching tool 300. In some embodiments, the wafer stage 306 may be configured to rotate such that a beam angle between the substrate 304 and the beam 302 may be between about 0° and about 90°, wherein a beam angle of 0° refers to a substantially perpendicular beam 302 relative to a major surface of the substrate 304 and a beam angle of about 90° refers to a beam 302 that is substantially parallel to major surface of the substrate 304.

The etching tool 300 may be configured to control a temperature of the wafer stage 306, the substrate 304, or both. By way of nonlimiting example, the wafer stage 306 may be cooled with one or more of an ice bath, liquid carbon dioxide, liquid nitrogen, backside gas cooling (e.g., such as with helium gas), or other method of cooling the wafer stage 306 and substrate 304. The etching tool 300 may be configured to maintain a temperature of the wafer stage 306 and the substrate 304 below about 0° C., such as below about −50° C., below about −100° C., below about −150° C., below about −200° C., or below about −250° C. during use and operation thereof.

Figure 4A:
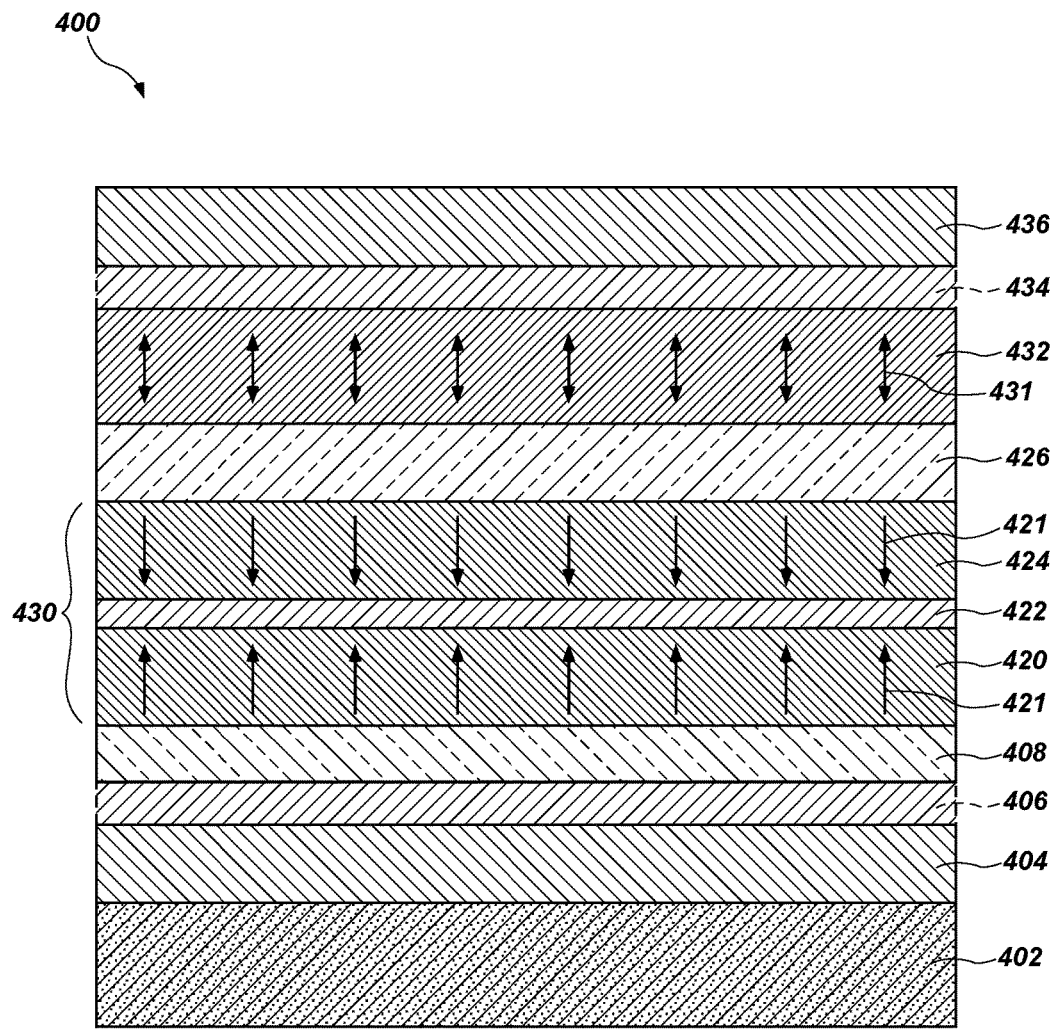
FIG. 4A and FIG. 4B are simplified cross-sectional views illustrating a method of forming the array of magnetic memory cells of FIG. 1, according to embodiments of the disclosure.
Figure 4B:
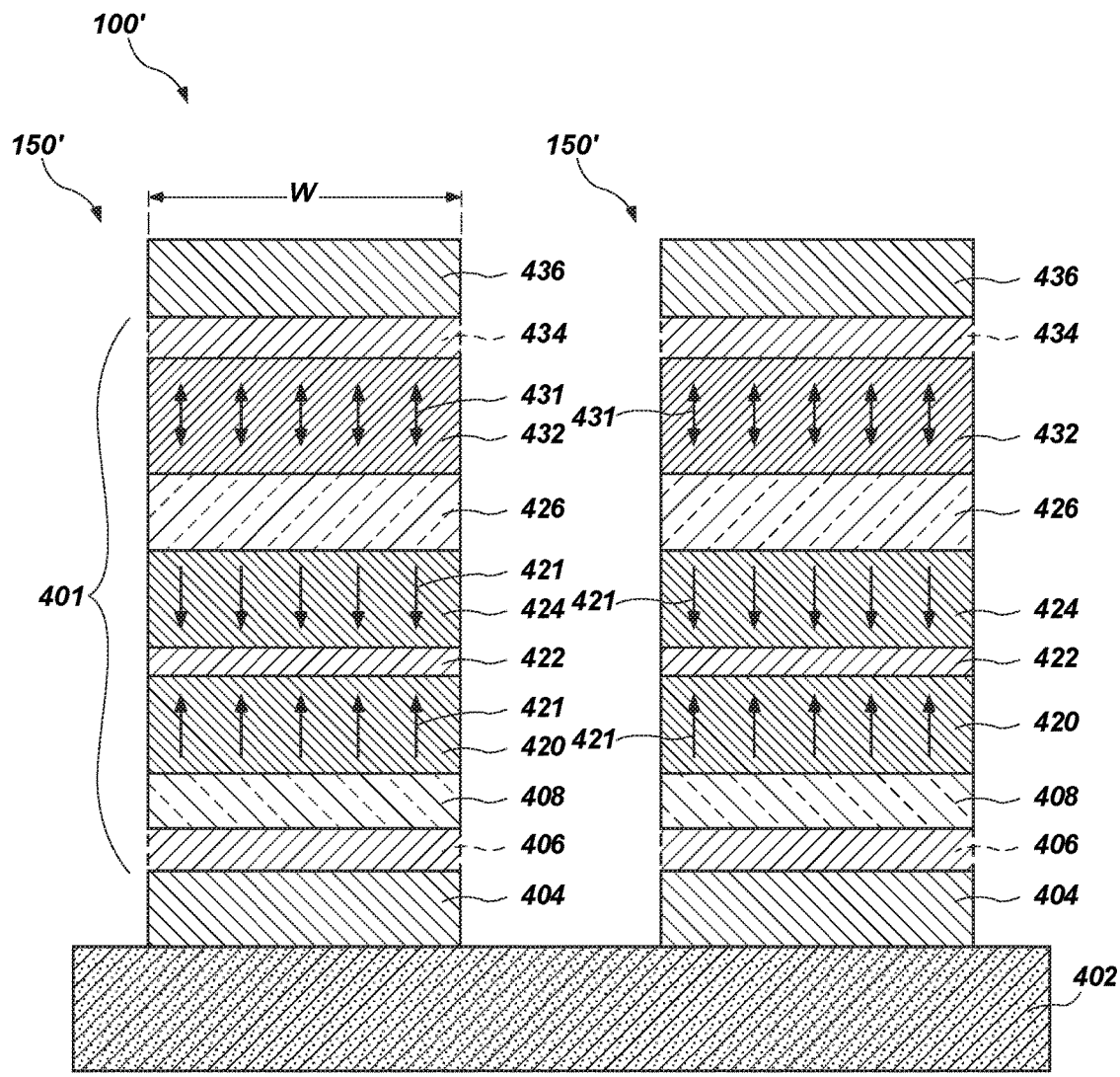

FIG. 4A and FIG. 4B illustrate a method of forming the array 100 of magnetic memory cells 150 of FIG. 1. The method may include forming a stack 400 of materials over a substrate 402. A lower electrode material 404 may be formed over the substrate 402. A lower intermediary region material 406 may, optionally, be formed over the lower electrode material 404. A seed material 408 may be formed over the lower intermediary region material 406 and a fixed region material 430 may be formed over the seed material 408. The fixed region material 430 may include a first magnetic portion material 420, a coupling material 422, and a second magnetic portion material 424. A tunnel barrier material 426 may be formed over the fixed region material 430 and a free region material 432 may be formed over the tunnel barrier material 426. An upper intermediary region material 434 may be formed over the free region material 432 and an upper electrode material 436 may be formed over the upper intermediary region material 434. Each of the substrate 402, the lower electrode material 404, the lower intermediary region material 406, the seed material 408, the fixed region material 430, the tunnel barrier material 426, the free region material 432, the upper intermediary region material 434, and the upper electrode material 436 may comprise the same materials described above with reference to FIG. 1 and each of the substrate 102, the lower electrode 104, the lower intermediary region 106, the seed material 108, the fixed region 130, the tunnel barrier material 126, the free region 132, the upper intermediary region 134, and the upper electrode 136, respectively. The first magnetic portion material 420 and the second magnetic portion material 424 may exhibit a fixed magnetic orientation, as indicated by arrows 421, and the free region material 432 may exhibit a free magnetic orientation, as indicated by arrows 431.

Each of the lower electrode material 404, the lower intermediary region 406, the seed material 408, the fixed region material 430, the tunnel barrier material 426, the free region material 432, the upper intermediary region material 434, and the upper electrode material 436 may be formed by conventional techniques, such as one or more of atomic layer deposition (ALD), chemical vapor deposition (CVD), physical vapor deposition (PVD), plasma enhanced chemical vapor deposition (PECVD), low pressure chemical vapor deposition (LPCVD), or other film deposition processes.

Referring to FIG. 4B, portions of the stack 400 (FIG. 4A) may be removed to form an array 100' of patterned magnetic memory cells 150'. Portions of the lower electrode material 404, the lower intermediary region material 406, the seed material 408, the fixed region material 430, the tunnel barrier material 426, the free region material 432, the upper intermediary region material 434, and the upper electrode material 436 may be removed to pattern a plurality of magnetic cell cores 401. As described above, in some embodiments, the stack 400 (FIG. 4A) may be patterned by one or both of ion beam etching (IBE) or neutral beam etching (NBE). In some embodiments, at least the fixed region material 430, the tunnel barrier material 426, and the free region material 432 may be patterned by IBE or NBE.

Figure 5:
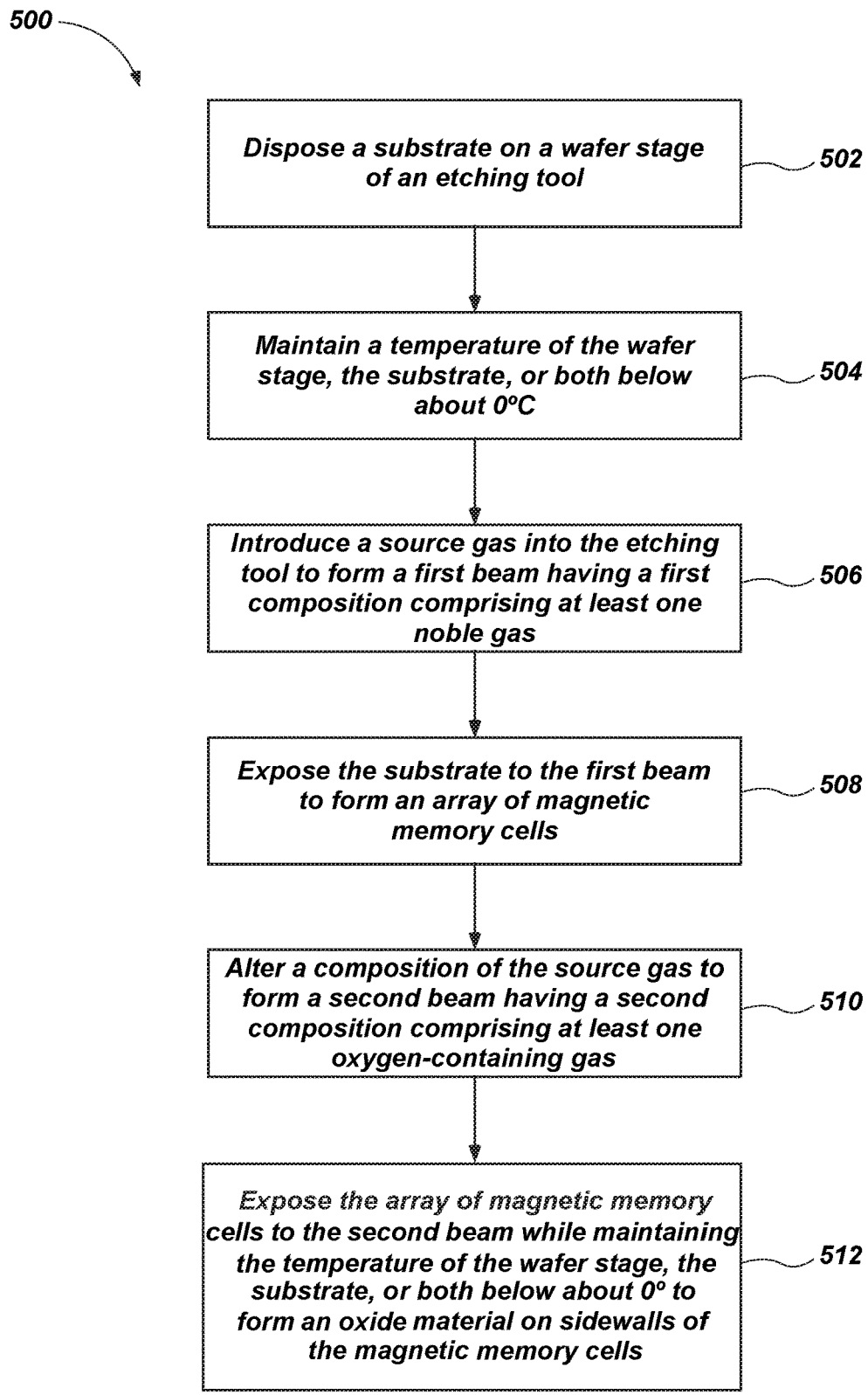
FIG. 5 is a simplified flow diagram illustrating a method of patterning magnetic memory cells, according to embodiments of the disclosure.

FIG. 5 is a simplified flow diagram illustrating a method 500 of forming the array 100, 100' (FIG. 1, FIG. 4B) of magnetic memory cells 150, 150' (FIG. 1, FIG. 4B). The method 500 comprises act 502 including disposing a substrate on a wafer stage of an etching tool, the substrate including the stack 400 (FIG. 4A) of materials; act 504 including maintaining a temperature of the wafer stage, the substrate, or both below about 0° C.; act 506 including introducing a source gas into the etching tool to form a first beam having a first composition comprising at least one noble gas; act 508 including exposing the substrate to the first beam to remove portions of the materials and form an array of magnetic memory cells; act 510 including altering a composition of the source gas to form a second beam having a second composition comprising at least one oxygen-containing gas; and act 512 including exposing the array of magnetic memory cells to the second beam while maintaining the temperature of the wafer stage, the substrate, or both below about 0° C. to form an oxide material on sidewalls of the magnetic memory cells.

Act 502 includes disposing a substrate on a wafer stage (e.g., wafer stage 306 (FIG. 3)) of an etching tool (e.g., etching tool 300 (FIG. 3)). In some embodiments, the substrate may be substantially similar to the stack 400 described above with reference to FIG. 4A.

Act 504 includes maintaining a temperature of the wafer stage, the substrate, or both below about 0° C. By way of nonlimiting example, the wafer stage may be maintained at a temperature between about 0° C. and about −273° C., such as between about 0° C. and about −250° C., between about 0° C. and about −50° C., between about −50° C. and about −100° C., between about −100° C. and about −150° C., between about −150° C. and about −200° C., or between about −200° C. and about −250° C. In some embodiments, the temperature may be below about 0° C., such as below about −50° C., below about −100° C., below about −150° C., below about −200° C., or below about −250° C.

Act 506 includes introducing a source gas into the etching tool to form a first beam having a first composition comprising at least one noble gas. The source gas and, therefore, the first beam may comprise a neutral beam comprising at least one noble gas, such as at least one of neon, argon, krypton, or xenon or an ion beam comprising ions of at least one noble gas, such as ions of neon ($Ne^+$), argon ($Ar^+$), krypton ($Kr^+$), or xenon ($Xe^+$). In some embodiments, the at least one noble gas may also include helium ($He^+$). In some embodiments, the at least one noble gas comprises or consists essentially of argon.

In some embodiments, the source gas may include at least one noble gas and at least one oxygen-containing gas. The oxygen-containing gas may comprise an oxidizing gas. The oxygen-containing gas may comprise one or more of oxygen ($O_2$), ozone ($O_3$), nitric oxide (NO), nitrous oxide ($N_2O$), nitrogen dioxide ($NO_2$), carbon monoxide (CO), or carbon dioxide ($CO_2$), or other oxygen-containing gas. In some embodiments, the oxygen-containing gas comprises oxygen ($O_2$).

The oxygen-containing gas may constitute between about 0 volume percent and about 100 volume percent of the source gas, such as between about 0 volume percent and about 60 volume percent, between about 0 volume percent and about 40 volume percent, or between about 0 volume percent and about 20 volume percent of the source gas. In other embodiments, the source gas may comprise or consist essentially of the oxygen-containing gas. In some such embodiments, the source gas may be substantially free of the at least one noble gas.

Act 508 includes exposing the substrate to the first beam to form an array of magnetic memory cells. The wafer stage, the substrate, or both may be maintained at a temperature below about 0° C. while the first beam contacts surfaces of the substrate and removes at least a portion of the stack 400 (FIG. 4A) of materials. In some embodiments, a plurality of magnetic memory cells may be patterned with a source gas comprising or consisting essentially of one or more noble gases. In other embodiments, the magnetic memory cells are patterned with a source gas comprising one or more noble gases and one or more oxygen-containing gases. In yet other embodiments, the magnetic memory cells are patterned with a source gas comprising an oxygen-containing gas.

An incident energy of the first beam may be greater than about 200 eV. In some embodiments, the beam energy of the first beam may be between about 200 eV and about 1,000 eV (about 1 keV), such as between about 400 eV and about 800 eV, or between about 500 eV and about 700 eV.

In some embodiments, an angle of the first beam (i.e., a beam angle) may be maintained between about 0° and about 45° while patterning the substrate. Stated another way, the beam angle of the first beam may be between about substantially perpendicular to a major surface of the substrate and about 45° with respect to the major surface of the substrate.

Act 510 may include altering a composition of the source gas to form a second beam having a second composition comprising at least one oxygen-containing gas. The composition of the source gas may be selected to comprise one or more oxygen-containing gases including at least one of oxygen, ozone, nitric oxide, nitrous oxide, nitrogen dioxide, carbon monoxide, or carbon dioxide, or other oxygen-containing gas. In some embodiments, the source gas may comprise or consist essentially of the oxygen-containing gas, such as oxygen ($O_2$). In other embodiments, a composition of the source gas may include at least one oxygen-containing gas and at least one noble gas.

In some embodiments, the oxygen-containing gas may constitute between about 1 volume percent and about 100 volume percent of the source gas, such as between about 1 volume percent and about 25 volume percent, between about 25 volume percent and about 50 volume percent, between about 50 volume percent and about 75 volume percent, or between about 75 volume percent and about 100 volume percent of the source gas. A remainder of the source gas may comprise the at least one noble gas. Accordingly, in some embodiments, the source gas comprises between about 0.1 part and about 10 parts of the oxygen-containing gas for every about 1 part of the noble gas, such as between about 0.1 part and about 0.2 part, between about 0.2 part and about 0.5 part, between about 0.5 part and about 1 part, between about 1 part and about 2 parts, between about 2 parts and about 5 parts, or between about 5 parts and about 10 parts of the oxygen-containing gas for every about 1 part of the noble gas.

Act 512 includes exposing the magnetic memory cells to the second beam while maintaining the temperature of the wafer stage, the substrate, or both below about 0° to form an oxide material on sidewalls of the magnetic memory cells. In some embodiments, the temperature is selected to be substantially the same as the temperature described above with reference to act 504. In other words, the temperature may be between about 0° C. and about −273° C., such as between about 0° C. and about −250° C., between about 0° C. and about −50° C., between about −50° C. and about −100° C., between about −100° C. and about −150° C., between about −150° C. and about −200° C., or between about −200° C. and about −250° C.

The second beam may comprise one or more of a neutral beam or an ion beam comprising the oxygen-containing gas, or the oxygen-containing gas and at least one noble gas. A beam energy of the second beam may be less than a beam energy of the first beam. The second beam may have a beam energy between about 10 eV and about 200 eV, such as between about 10 eV and about 50 eV, between about 50 eV and about 100 eV, or between about 100 eV and about 200 eV. Accordingly, the beam energy of the second beam may be less than about 200 eV, such as less than about 100 eV, or even less than about 50 eV.

The beam angle of the second beam may be between about 45° and about 90°, such as between about 60° and about 85°, or between about 70° and about 80°. In some embodiments, the beam angle of the second beam may be different than the beam angle of the first beam. Without wishing to be bound by any particular theory, it is believed that selecting the source gas of the second beam to comprise the oxygen-containing gas and selecting the beam angle of the second beam to be between about 45° and about 90° may facilitate forming an oxide material (e.g., the oxide material 140 (FIG. 1)) on sidewalls of the magnetic memory cells.

After forming the oxide material 140, the substrate may include an array 100 of magnetic memory cells 150, each magnetic memory cell 150 comprising a magnetic cell core 101, and an oxide material 140 on sidewalls thereof, as described above with reference to FIG. 1. Forming the oxide material may substantially reduce a likelihood of the magnetic memory cell 150 shorting between the lower electrode 104 (FIG. 1) and the upper electrode 136 (FIG. 1). By way of comparison, magnetic memory cells formed according to conventional patterning processes may include a resputtered conductive material on sidewalls of material stacks. The resputtered conductive material may electrically connect an upper electrode and a lower electrode and cause shorting therebetween. Forming the oxide material 140 according to embodiments of the disclosure may include forming an electrically insulative oxide material from an electrically conductive material.

Accordingly, in some embodiments, a method of forming a magnetic memory cell comprises forming a magnetic cell core material over a substrate, forming the magnetic cell core material comprising forming a first magnetic region over the substrate, forming a tunnel barrier material over the first magnetic region, and forming a second magnetic region over the tunnel barrier material. A temperature of at least one of the substrate or a wafer stage underlying the substrate is maintained at a temperature below about 0° C. and the magnetic cell core material is exposed to at least a first beam comprising one of an ion beam or a neutral beam comprising ions or elements of at least one noble gas to remove portions of the magnetic cell core material.

Accordingly, in other embodiments, a method of forming an array of magnetic memory cells comprises forming a stack of magnetic materials comprising a first magnetic material over a substrate, a tunnel barrier material over the first magnetic material, and at least a second magnetic material over the tunnel barrier material and exposing the stack of magnetic materials to a first beam comprising at least one noble gas at a beam angle between about 0° and about 45° while maintaining a temperature of the substrate or a wafer stage on which the substrate is disposed below about 0° C. to remove portions of the stack and form a plurality of magnetic memory cells.

Accordingly, in yet other embodiments, a method of forming an array of memory cells comprises disposing a substrate including a stack of magnetic materials over the substrate on a wafer stage of an etching tool, maintaining a temperature of at least one of the substrate or the wafer stage below about 0° C., and exposing the stack of magnetic materials to a first beam comprising at least one noble gas and having a first beam energy to form magnetic memory cells over the substrate. The substrate is exposed to a second beam comprising at least one oxygen-containing gas and having a second beam energy lower than the first beam energy.

Forming the magnetic memory cells 150, 150' (FIG. 1, FIG. 4B) at substrate and wafer stage temperatures below about 0° C. and with the source gases described above may form magnetic memory cells exhibiting improved magnetic properties. By way of nonlimiting example, one or more of a coercivity, a resistance of the magnetic tunnel junction, a TMR, a switching current density, or other property of the magnetic memory cells may be improved compared to when the magnetic memory cells are patterned at temperatures above about 0° C., such as at temperatures of about 25° C. By way of nonlimiting example, the magnetic memory cells 150, 150' may exhibit a TMR between about 100% and about 200%, such as between about 100% and about 150%, or between about 150% and about 200% while magnetic memory cells formed by conventional methods may exhibit a TMR up to about 100%.

The magnetic memory cells 150, 150' may exhibit a homogeneous crystal structure substantially free of any crystal lattice mismatch. For example, the fixed region 130 (FIG. 1), the free region 132 (FIG. 1), and the tunnel barrier material 126 (FIG. 1) may each comprise a varying purity across a width (W) thereof with an increasing purity extending in a direction away from exposed portions thereof and toward, for example, a laterally central portion of the magnetic cell core 101 (FIG. 1). In some embodiments, the materials of each of the fixed region 130, the tunnel barrier material 126, and the free region 132 may exhibit a purity varying between about 95 percent and about 99 percent proximate sidewalls thereof to about 100 percent at a depth between about 1 nm and about 2 nm from the sidewalls. Stated another way, each of the fixed region 130, the tunnel barrier material 126, and the free region 132 may include a varying concentration of a component of the first beam or the second beam (e.g., argon, oxygen, etc.) with an increased concentration proximate the sidewalls. In some embodiments, a concentration of the at least one noble gas or the at least one oxygen-containing gas may vary from between about $1 \times 10^7$ atoms/cm$^3$ and about $1 \times 10^8$ atoms/cm$^3$ at a region proximate the sidewalls to about 0 atom/cm$^3$ at a depth between about 1 nm and about 2 nm from the sidewalls. In some embodiments, the magnetic memory cells 150, 150' may exhibit a varying degree of lattice mismatch across a width thereof with a higher degree of lattice mismatch proximate the sidewalls and a reduced amount of lattice mismatch in a direction toward the laterally central portion of the magnetic cell core 101. In some embodiments, the magnetic memory cells 150, 150' may exhibit substantially no lattice mismatch at about 1 nm or about 2 nm from the sidewalls.

By way of contrast, magnetic memory cells formed by conventional methods may include an increased concentration of impurities and at greater depths than those described above and may, therefore, exhibit a greater amount of crystal lattice mismatch and reduced magnetic properties. Without wishing to be bound by any particular theory, it is believed that forming the magnetic memory cells 150, 150' at a temperature below about 0° may substantially reduce an amount of diffusion of impurities in each of the fixed region 130, the tunnel barrier material 126, and the free region 132 and may substantially reduce a degree of lattice mismatch thereof. By way of nonlimiting example, magnetic memory cells formed according to the methods described herein may exhibit less than about one-half a lattice damage of a magnetic memory cell formed by conventional methods. For example, magnetic memory cells formed by conventional methods may exhibit a damage in a lattice structure of the magnetic materials and tunnel barrier materials up to a depth of at least about 5 nm from exposed sidewalls thereof while, in some embodiments, magnetic memory cells formed according to the methods described herein may not exhibit lattice damage beyond about 2 nm from exposed sidewalls thereof. In some embodiments, magnetic memory cells formed according to the methods described herein may exhibit a TMR up to about 50% greater than a TMR of a conventional magnetic memory cell. In some embodiments, magnetic memory cells formed according to the methods described herein may exhibit a resistance between electrodes (e.g., between the lower electrode 104 (FIG. 1) and the upper electrode 136 (FIG. 1)) that is about one-half a resistance of a conventional magnetic memory cell. In some embodiments, the magnetic memory cell may be reduced from about 10 kΩ to about 5 kΩ.

The magnetic memory cells and arrays of magnetic memory cells formed according to the methods described herein may exhibit an improved performance. For example, magnetic memory cells formed according to the methods described herein may exhibit a reduced likelihood of device failure, such as by shorting (e.g., between the upper electrode 136 (FIG. 1) and the lower electrode 104 (FIG. 1). By way of comparison, up to about 10 percent of magnetic memory cells formed according to conventional methods may fail while less than about 0.0010 percent of magnetic memory cells formed according to the methods described herein may fail. Without wishing to be bound by any particular theory, it is believed that formation of the oxide material 140 (FIG. 1) substantially reduces a likelihood of shorting of the magnetic memory cells 150 (FIG. 1).

Accordingly, in some embodiments, a magnetic memory cells comprises a magnetic cell core comprising a first magnetic region over a substrate, a tunnel barrier material over the first magnetic region, and a second magnetic region over the tunnel barrier material. The magnetic memory cell further comprises an oxide material over sidewalls of the magnetic cell core, wherein the magnetic cell core exhibits a homogeneous crystal structure with an increasing purity in a direction toward a laterally central portion of the magnetic cell core.

Figure 6:
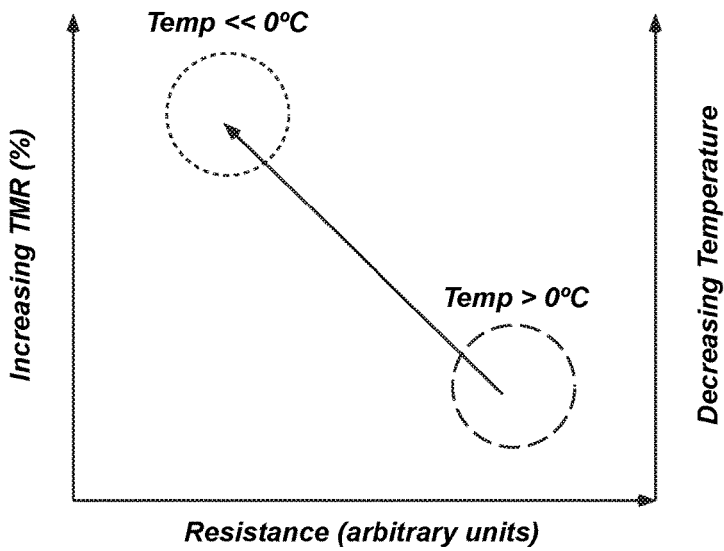
FIG. 6 is a graph illustrating a relationship between each of electrical resistance of a magnetic tunnel junction and tunnel magnetoresistance (TMR) of the magnetic tunnel junction as a function of patterning temperature.

FIG. 6 is a graph illustrating each of a TMR and an overall resistance of a magnetic tunnel junction formed (e.g., patterned) at different temperatures. For example, when the magnetic tunnel junction is formed at lower temperatures, the magnetic tunnel junction exhibits an increased TMR and a reduced resistance, as illustrated in the upper left portion of the graph. By way of contrast, and as illustrated in the lower right corner of the graph, when formed at relatively higher temperatures, the magnetic tunnel junction exhibits a reduced TMR and a higher resistance.

Figure 7:
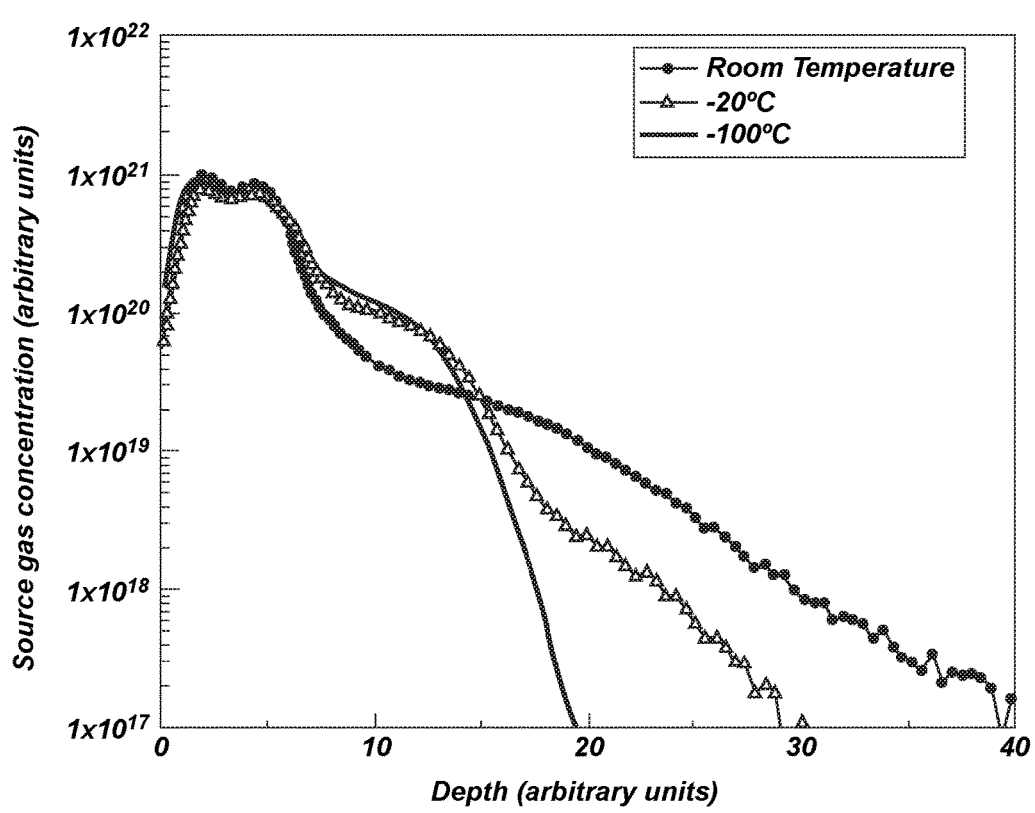
FIG. 7 is a graph illustrating an amount of source gas diffusion as a function of diffusion depth in a substrate at different patterning temperatures.

FIG. 7 is a graph illustrating an amount of source gas diffusion as a function of diffusion depth in a substrate at different patterning temperatures (e.g., room temperature, −20° C., and −100° C.). As illustrated, a material being patterned may include a lower concentration of diffused source gases when the material is patterned at lower temperatures compared to when the material is patterned at higher temperatures. In addition, source gases may diffuse only to shallower depths in materials patterned at lower temperatures.

Without wishing to be bound by any particular theory, it is believed that at temperatures below about 0° C., a reduced amount of elemental diffusion and intermixing between adjacent materials of the magnetic tunnel junction occurs. In addition, at lower temperatures, an amount of diffusion of source gases from a beam into a material being patterned is substantially reduced.

Figure 8A:
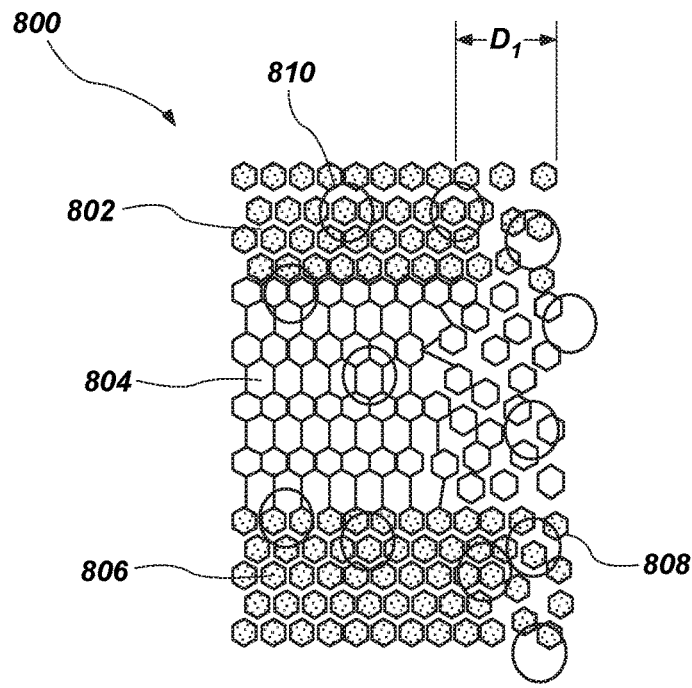
FIG. 8A and FIG. 8B are simplified cross-sectional views illustrating a crystal structure of a magnetic tunnel junction formed at temperatures above about 0° C. and below about 0° C., respectively.
Figure 8B:
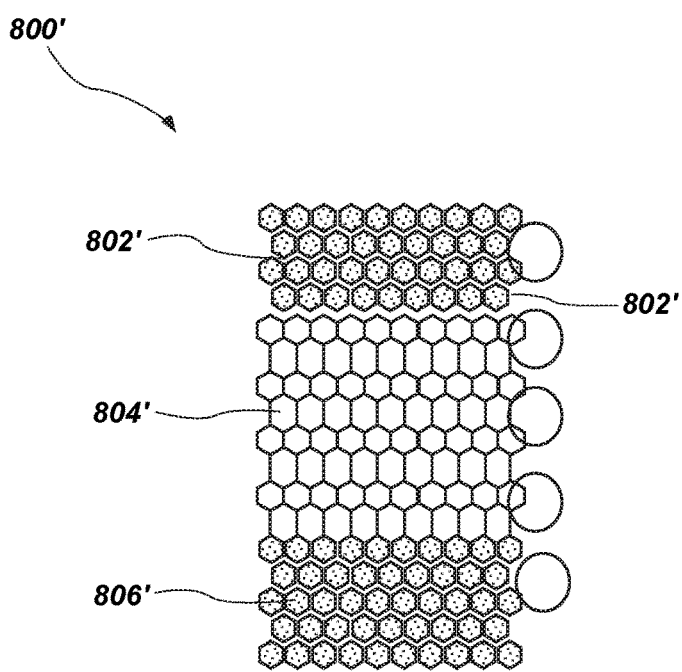

FIG. 8A and FIG. 8B illustrate magnetic tunnel junctions 800, 800' patterned at a temperature above about 0° C. and at a temperature below about 0° C., respectively. As illustrated in FIG. 8A, the magnetic tunnel junction 800 patterned at a temperature above about 0° C. exhibits a distorted crystal structure (e.g., a lattice mismatch) in each of a first magnetic material 802, a second magnetic material 806, and a tunnel barrier material 804 between the first magnetic material 802 and the second magnetic material 806. The magnetic tunnel junction 800 may exhibit a distortion in the crystal structure of the tunnel barrier material 804 up to a depth $D_1$ measured from a sidewall 808 of the magnetic tunnel junction 800. In addition, the magnetic tunnel junction 800 may include an increased concentration of etchant gases 810 (e.g., oxygen atoms, argon atoms, etc.) dispersed therein.

By way of contrast, and referring to FIG. 8B, the magnetic tunnel junction 800' formed according to embodiments of the disclosure (i.e., patterned at temperatures lower than about 0° C.), may be substantially free of crystal defects in each of a first magnetic material 802', a second magnetic material 806', and an intervening tunnel barrier material 804'. The magnetic tunnel junction 800' may not exhibit a lattice mismatch in any of the first magnetic material 802', the second magnetic material 806', or the tunnel barrier material 804'. In addition, the magnetic tunnel junction 800' may be substantially free of diffused etchant gases 810 in the crystal structure thereof.

Accordingly, forming the array 100 of magnetic memory cells 150 (FIG. 1) at a temperature below about 0° C. may increase magnetic properties of the magnetic memory cells 150. In some embodiments, elements from the fixed region 130 (FIG. 1) may not substantially diffuse and intermix with elements of the tunnel barrier material 126 (FIG. 1). Similarly, elements of the free region 132 may not substantially intermix with elements of the tunnel barrier material 126. Accordingly, interfaces between the fixed region 130 and the tunnel barrier material 126 and between the free region 132 and the tunnel barrier material 126 may be substantially free of intermixed elements and may be distinct.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a magnetic memory cell, the method comprising:
    forming a magnetic cell core material over a base material, forming the magnetic cell core material comprising:
        forming a first magnetic region over the base material;
        forming a tunnel barrier material over the first magnetic region; and
        forming a second magnetic region over the tunnel barrier material;
    maintaining a temperature of at least one of the base material or a wafer stage underlying the base material at a temperature below about 0° C.;
    exposing the magnetic cell core material to at least a first beam comprising one of an ion beam or a neutral beam comprising ions or elements of at least one noble gas to remove portions of the magnetic cell core material while the temperature of the at least one of the base material or the wafer stage is below about 0° C.; and
    exposing the magnetic cell core material to a second beam comprising one of an ion beam or a neutral beam comprising at least one noble gas and at least one oxygen-containing gas.

2. The method of claim 1, wherein exposing the magnetic cell core material to the at least a first beam comprises exposing the magnetic cell core material to the at least a first beam while maintaining the temperature of at least one of the base material or the wafer stage below about −50° C.

3. The method of claim 1, wherein exposing the magnetic cell core material to at least a first beam comprises exposing the magnetic cell core to a first beam having an energy between about 200 eV and about 1,000 eV.

4. The method of claim 1, further comprising selecting the at least one noble gas of the first beam to comprise at least one of neon, argon, or krypton.

5. The method of claim 1, wherein:
    exposing the magnetic cell core material to at least a first beam comprises forming a magnetic memory cell; and
    exposing the magnetic cell core material to a second beam comprising one of an ion beam or a neutral beam comprising at least one noble gas and at least one oxygen-containing gas comprises forming an oxide material over sidewalls of the magnetic memory cell.

6. The method of claim 1, further comprising selecting the at least one oxygen-containing gas to comprise at least one of oxygen, ozone, nitric oxide, nitrous oxide, nitrogen dioxide, carbon monoxide, or carbon dioxide.

7. The method of claim 1, further comprising selecting the second beam to comprise between about 0.1 part and about 10 parts of the oxygen-containing gas for every about 1 part of the at least one noble gas.

8. The method of claim 1, further comprising selecting a beam angle of the second beam to be between about 45° and about 90° to form an oxide material on sidewalls of the magnetic memory cell.

9. The method of claim 1, wherein exposing the magnetic cell core material to a second beam comprises selecting a beam energy of the first beam to be greater than a beam energy of the second beam.

10. The method of claim 1, wherein maintaining a temperature of at least one of the base material or a wafer stage underlying the base material at a temperature below about 0° C. comprises cooling the wafer stage with an ice bath, liquid carbon dioxide, or liquid nitrogen.

11. The method of claim 1, wherein exposing the magnetic cell core material to at least a first beam comprises exposing the magnetic cell core material to a first beam consisting essentially of an oxygen-containing gas.

12. A method of forming an array of magnetic memory cells, the method comprising:
    forming a stack of magnetic materials comprising a first magnetic material over a base material, a tunnel barrier material over the first magnetic material, and at least a second magnetic material over the tunnel barrier material;

exposing the stack of magnetic materials to a first beam comprising at least one noble gas at a beam angle between about 0° and about 45° while maintaining a temperature of the base material or a wafer stage on which the base material is disposed below about 0° C. to remove portions of the stack and form a plurality of magnetic memory cells; and exposing the stack of magnetic materials to a second beam comprising an oxygen-containing gas to form an oxide material on the stack of magnetic materials.

13. The method of claim 12, further comprising selecting the first beam to comprise the at least one noble gas and at least one oxygen-containing gas.

14. The method of claim 12, wherein exposing the stack of magnetic materials to a second beam comprises exposing the plurality of magnetic memory cells to a second beam comprising at least one oxygen-containing gas and at least one noble gas, the second beam having a beam angle between about 45° and about 90° to form the oxide material.

15. The method of claim 12, further comprising selecting a beam angle of the second beam to be greater than the beam angle of the first beam.

16. The method of claim 12, further comprising selecting a beam energy of the second beam to be less than a beam energy of the first beam.

17. The method of claim 12, further comprising maintaining a temperature of the base material or the wafer stage at a temperature below about 0° C. while exposing the plurality of magnetic memory cells to the second beam.

18. The method of claim 12, wherein maintaining a temperature of the base material or a wafer stage on which the base material is disposed below about 0° C. comprises selecting the temperature to be less than about −50° C.

19. The method of claim 12, wherein forming an oxide material on the stack of magnetic materials comprises forming the oxide material on sidewalls of the stack to comprise a metal oxide of a material in contact with the oxide material.

* * * * *